United States Patent
Miyata

(10) Patent No.: US 9,525,266 B2
(45) Date of Patent: Dec. 20, 2016

(54) LASER SOURCE DEVICE AND ADJUSTMENT METHOD THEREOF

(71) Applicant: MITUTOYO CORPORATION, Kanagawa (JP)

(72) Inventor: Kaoru Miyata, Ibaraki (JP)

(73) Assignee: MITUTOYO CORPORATION, Kanagawa (JP)

( * ) Notice: Subject to any disclaimer, the term of this patent is extended or adjusted under 35 U.S.C. 154(b) by 0 days.

(21) Appl. No.: 15/048,338

(22) Filed: Feb. 19, 2016

(65) Prior Publication Data

US 2016/0248222 A1 Aug. 25, 2016

(30) Foreign Application Priority Data

Feb. 25, 2015 (JP) .................................. 2015-035642

(51) Int. Cl.
*H01S 5/022* (2006.01)
*H01S 5/026* (2006.01)

(52) U.S. Cl.
CPC ......... *H01S 5/02292* (2013.01); *H01S 5/0264* (2013.01); *H01S 5/02288* (2013.01)

(58) Field of Classification Search
CPC .................. H01S 5/02292; H01S 5/02288
See application file for complete search history.

(56) References Cited

U.S. PATENT DOCUMENTS

| 6,115,401 A * | 9/2000 | Scobey | H01S 3/08036 |
| | | | 372/100 |
| 2006/0167641 A1 * | 7/2006 | Chamberlin | B82Y 20/00 |
| | | | 702/75 |

FOREIGN PATENT DOCUMENTS

JP 2014-11442 1/2014

\* cited by examiner

*Primary Examiner* — Dung Nguyen
(74) *Attorney, Agent, or Firm* — Greenblum & Bernstein, P.L.C.

(57) ABSTRACT

A laser source device includes a laser source element configured to emit a laser beam, an optical element disposed downstream of the laser source element, and a return-light-receiving surface at a position shifted in a direction intersecting an active layer of the laser source element. The optical element is tilted with respect to an optical axis of the laser beam so that a return light in a form of a laser beam reflected by the optical element is incident on the return-light-receiving surface.

4 Claims, 6 Drawing Sheets

LASER SOURCE DEVICE AND ADJUSTMENT METHOD THEREOF

The entire disclosure of Japanese Patent Application No. 2015-035642 filed Feb. 25, 2015 is expressly incorporated by reference herein.

TECHNICAL FIELD

The present invention relates to a laser source device configured to emit a laser beam and an adjustment method thereof.

BACKGROUND ART

Laser beam has been used in various applications (e.g. measurement and communication). Especially, a semiconductor laser with a light source of a laser diode and the like is used in a field where stability in strength and wavelength of the laser beam is desired.

Such a semiconductor laser is provided by a laser source device including a laser source element for emitting a laser beam and an optical element disposed downstream of the laser source element.

The optical element used herein is exemplified by a collimating lens, an optical filter such as an etalon plate, polarization plate and various wave plates, a prism, a protection transparent plate and a combination thereof.

In the laser source device, the laser beam from the laser source element is sometimes reflected by the downstream optical element to return back to the laser source element (a return light).

Especially, when the surface of the optical element is flat, the strength of the return light increases in the same direction and, when there is a collimating lens, the return light passing through the collimating lens may sometimes converges to the laser source element.

When the return light is incident on the laser source element, the oscillation in the laser source element becomes unstable to disadvantageously change the strength and wavelength of the laser beam to be emitted.

In order to restrain the return light from being incident on the laser source element, an antireflection film on the optical element or an optical isolator has been provided.

Among the above, when an antireflection film is provided to an optical element, the transmittance of the optical element can be enhanced to reduce the return light.

However, a large cost is required for providing a high-transmittance antireflection film and the transmittance-enhancement effect of the antireflection film is anyhow limited. In addition, the antireflection film cannot be formed on some of the optical elements.

On the other hand, the optical isolator is expensive and entails size enlargement and design complication of the laser source device.

In order to more easily restrain the return light, it has been proposed to incline the optical element with respect to a main optical axis of the laser beam (see, for instance, Patent Literature 1: JP-A-2014-11442).

It should be noted that the laser beam emitted from the laser source element has an astigmatic difference (i.e. a difference between a focus in a direction along an active layer and a focus in a direction intersecting the active layer), so that the beam shape (i.e. cross sectional shape of the beam) changes along the optical axis.

As shown in FIG. 6, a laser source device 90 includes a laser source element 91 that emits a laser beam 99 and a case 92 that houses the laser source element 91.

The laser source element 91 has an active layer disposed along Z and X directions in the figure, so that the laser beam 99 is emitted in the Z direction. The beam shape of the laser beam 99 is defined by a cross section along the X and Y directions.

A photodetector 93 for output control is disposed on the back side of the laser source element 91.

The beam shape of the laser beam 99 emitted from the laser source element 91 defines an ellipse having an X-direction length NX longer than a Y-direction length NY and a long axis along the X direction in a region near the laser source element 91 (near-field).

On the other hand, in a region far from the laser source element 91 relative to the near-field (far-field), the beam shape of the laser beam defines an ellipse having the Y-direction length FY longer than the X-direction length FX and the long axis along the Y direction (i.e. a direction intersecting the active layer)

The above-described change in the beam shape due to the astigmatic difference (i.e. the change in the long-axis direction of ellipse) is not considered in the above-described Patent Literature 1, and the return light cannot be sufficiently kept from being incident on the laser source element according to the solution of Patent Literature 1.

Specifically, the optical element may be tilted to, for instance, shift the direction of the return light toward the laser source element in the Y direction so as not for the return light to be incident on the laser source element.

However, the return light reflected by the optical element in the far-field forms an ellipseal spot having a long axis in the Y direction near the laser source element.

When the beam shape of the return light is an ellipse having a long axis in the direction, it is possible that a part of the return light is incident on the laser source element even when the return light is shifted in the Y direction, thus failing to emit a stable laser beam.

When the laser beam forms the ellipseal spot as described above, it is possible to prevent the return light from being incident on the laser source element by further increasing the installation angle of the optical element.

However, a further increase in the installation angle of the optical element entails an increase in the size of the device and consequent reduction in the rigidity and temperature-stability of the device.

Further, the installation angle cannot be greatly changed in some optical elements. For instance, when an etalon is used as the optical element, the transmissive wavelength and transmissive light volume change according to the installation angle, so that the installation angle cannot be greatly changed.

SUMMARY OF THE INVENTION

An object of the invention is to provide a laser source device capable of emitting a stable laser beam at a low cost and with a simple arrangement, and an adjustment method thereof.

A laser source device according to an aspect of the invention includes: a laser source element configured to emit a laser beam; an optical element disposed downstream of the laser source element; and a return-light-receiving surface provided at a position shifted in a direction intersecting an active layer of the laser source element, in which the optical element is tilted with respect to an optical axis of the laser beam so that a return light of the laser beam reflected by the optical element is incident on the return-light-receiving surface.

In the above aspect of the invention, since the optical element is tilted, the return light from the optical element is incident on the return-light-receiving surface and is not incident on the laser source element. Accordingly, the generation of the laser beam in the laser source element is not influenced by the return light and a stable laser beam can be obtained.

Further, since the optical element is tilted and the return-light-receiving surface is oriented in the direction intersecting the active layer of the laser source element, the beam shape of the laser beam (return light) incident on the return-light-receiving surface assumes an ellipse that is thinned in the direction intersecting the active layer and has a long axis extending in the direction along the active layer especially when the collimator lens is provided, so that the tilt angle of the optical element can be minimized.

In other words, even when the tilt angle of the optical element is small, the return light incident on the return-light-receiving surface can be kept from, even partially, being incident on the laser source element (i.e. when the beam shape of the return light is elongated in the direction intersecting the active layer).

Further, most of the laser source devices includes a photodetector for laser output control at a back side of the laser source element. In such an arrangement, since the return light is received by the return-light-receiving surface as described above, the return light is kept from being incident on the photodetector, thereby preventing the influence of the return light on the photodetector and stabilizing the laser output control.

In the laser source device according to the above aspect of the invention, it is preferable that the laser source element is supported by a support oriented in the direction intersecting the active layer of the laser source element, a surface of the support defining the return-light-receiving surface.

In the above arrangement, since the return-light-receiving surface is defined by the surface of the support, the structure can be simplified by the dual purpose use of the component.

In the laser source device, the laser source element is housed in the case and is supported by the support fixed to a base of the case. The support often also serves as a heat sink for diffusing the heat generated by the laser source element, and is disposed on a flat side (at least one of top and bottom sides: i.e. a side oriented in parallel to the active layer) of the laser source element for the benefit of heat transfer performance. Accordingly, since the return-light-receiving surface is defined with the use of the support, the structure can be simplified.

In the laser source device according to the above aspect of the invention, it is preferable that a collimating lens disposed between the optical element and the laser source element is further provided, in which the collimating ns collimates a component of the laser beam in the direction intersecting the active layer into a parallel beam, the collimating lens being provided in the optical axis of the laser beam and in a region where a beam shape of the laser beam is an ellipse elongated in the direction intersecting the active layer.

According to the above arrangement, the beam shape of the return light incident on the return-light-receiving surface can be thinned in the direction intersecting the active layer, so that the tilt angle of the optical element for keeping the return light from being incident on the laser source element can be minimized. In other words, even when the tilt angle of the optical element is small, the return light incident on the return-light-receiving surface can be kept from, even partially, being incident on the laser source element.

In more detail, due to the astigmatic difference of the laser source element, the beam shape of the laser beam is an ellipse having a long axis along the active layer in the emitting end of the laser beam (near-field). However, the beam shape of the ser beam is an ellipse having a long axis in the direction intersecting the active layer in a sufficiently remote region (far-field).

In the above, the collimating lens is disposed so that the beam in the long axis direction of the ellipse in the far field is collimated. In the above arrangement, the beam shape of the light returning from the optical element to the laser source element near the emitting end is, similarly to the beam shape when the laser beam is emitted, an ellipse haying a long axis extending in a direction along the active layer. Accordingly, even when the tilt angle of the optical element is small, the return light is kept from being incident on the light-emitting region (active layer) of the laser source element or the photodetector.

An adjustment method according to another aspect of the invention is for a laser source device, the laser source device including a laser source element configured to emit a laser beam, an optical element disposed downstream of the laser source element, a return-light-receiving surface disposed at a position shifted in a direction intersecting an active layer of the laser source element and a photodetector disposed opposite the optical element with respect to the laser source element, the optical element being tilted with respect to an optical axis of the laser beam so that a return light of the laser beam reflected by the optical element is incident on the return-light-receiving surface, the method including: adjusting a tilt of the optical element with respect to the direction intersecting the active layer while monitoring an output signal of the photodetector; and fixing the tilt of the optical element when the output signal of the photodetector falls at or below a predetermined threshold.

According to the above aspect of the invention, whether the return light is incident on the laser source element or on the return-light-receiving surface can be judged by detecting the return light incident on the laser source element, which is expressed in a form of the output signal of the photodetector.

When the optical element is not tilted, the return light is incident on the laser source element and the output signal of the photodetector is at a high level. When the tilt of the optical element is increased to shift an incident position of the return light from the laser source element to the return-light-receiving surface, the level of the output signal of the photodetector is lowered.

Accordingly, when the tilt angle is fixed in a state where the output signal of the photodetector falls at or below the predetermined threshold, the optical element can be set at the minimum tilt angle for preventing the return t from being incident on the laser source element.

According to the laser source device and the adjustment method of the laser source device of the invention, a stable laser beam can be emitted at a low cost and with a simple structure.

BRIEF DESCRIPTION OF DRAWING(S)

DESCRIPTION OF EMBODIMENT(S)

Exemplary embodiment(s) of the invention will be described below with reference to the attached drawings.

Figure 1:
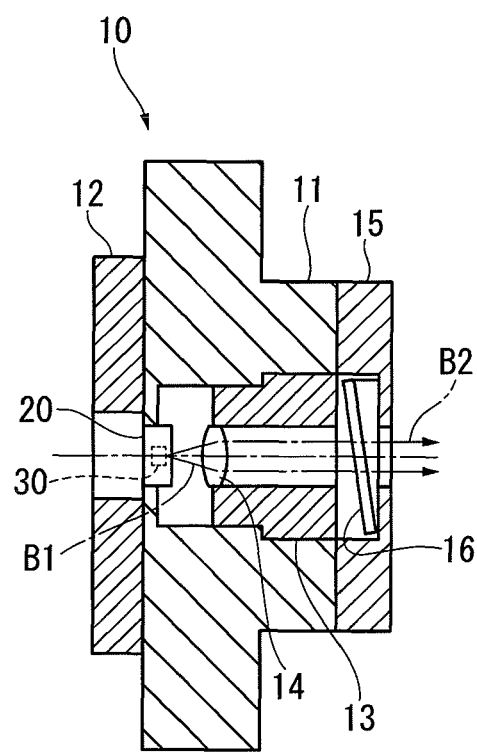
FIG. 1 is a cross sectional view showing an exemplary embodiment of the invention.

As shown in FIG. 1, a laser source device 10 includes a hollow cylindrical body 11 having a flange on an outer circumferential surface thereof.

A back plate 12 is fixed on a backside of the body 11. A semiconductor laser source element 20 is disposed in the body 11 near the back plate 12.

A laser beam B1 is emitted from the semiconductor laser source element 20 toward a front side of the body 11. The laser beam B1 is a diffusive light beam having a main optical axis in the Z direction.

A lens holder 13 is attached to an inside of the body 11 from a front side thereof.

The lens holder 13 is a hollow cylindrical member. A collimating lens 14 is fixed in the hollow portion of the lens holder 13 in a manner facing the semiconductor laser source element 20.

The collimating lens 14 collimates the laser beam B1 emitted by the semiconductor laser source element 20. The collimated laser beam B2 is a parallel beam in the Z direction.

An outer circumferential surface of the lens holder 13 is screwed to an inner circumferential surface of the body 11. The lens holder 13 is movable in a central axis direction (i.e. an optical axis direction of the laser beams B1, B2, Z direction) by rotating the lens holder 13 with respect to the body 11. Accordingly, a focus adjustment for the semiconductor laser source element 20 can be performed by rotating the lens holder 13.

An optical element holder 15 is fixed on the front side of the body 11 so as to cover the lens holder 13.

The optical element holder 15 is a disc-shaped member with a hollow center. An optical filter 16 is fixed to the hollow portion of the optical element holder 15 facing the lens holder 13.

The optical filter 16 is, for instance, an etalon plate, and has mutually parallel flat front and back surfaces.

The optical filter 16 is fixed to the optical element holder 15 in a manner tilted in the Y direction by an angle θ with respect to the Z-direction axis line (i.e. the optical axes of the laser beams B1, B2).

Figure 2:
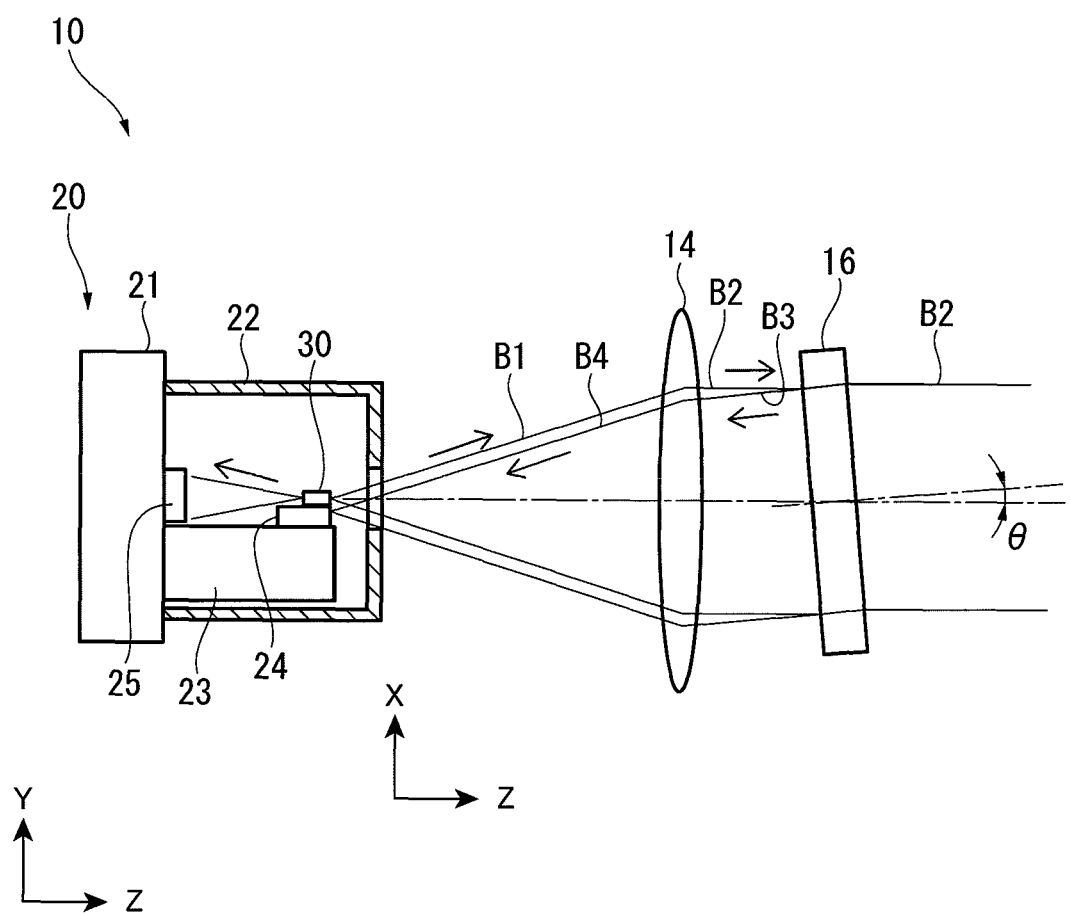
FIG. 2 is a schematic illustration showing a relevant part of the exemplary embodiment.

As shown in FIG. 2, the semiconductor laser source element 20 includes abuse 21, a case 22 and a laser source element 30 using a laser diode housed in the case 22.

A bracket 23 is fixed to apart of the base 21 covered with the case 22. A saddle 24 is fixed to an end of the bracket 23 and the laser source element 30 is supported on the saddle 24.

The bracket 23 and the saddle 24 serve as a support of the laser source element 30 and also as a heat sink for diffusing the heat from the laser source element 30.

A photodetector 5 for output control is disposed on the base 21 at aback side (i.e. opposite the front side facing the collimating lens 14) of the laser source element 30.

The laser beam emitted from the laser source element 30 in a direction opposite the direction of the laser beam B1 is incident on the photodetector 25.

in the semiconductor laser source element 20, the laser beam B1 emitted from the laser source element 30 is collimated by the collimating lens 14 to be turned into the laser beam 82. The laser beam B2 is transmitted to an outside of the laser source device 10 through the optical filter 16.

At this time, a part of the laser beam B2 (laser beam 83) is reflected on the surface of the optical filter 16 to pass through the collimating lens 14 in an opposite direction to be converged (laser beam B4). The laser beam B4 defines the return light to be returned to the semiconductor laser source element 20.

The optical filter 16 is tilted in the Y direction by the angle θ, so that the laser beam B4 (return light) is not incident on the laser source element 30 but is incident on a surface of the saddle 24 shifted from the laser source element 30 in the Y direction.

Figure 3:
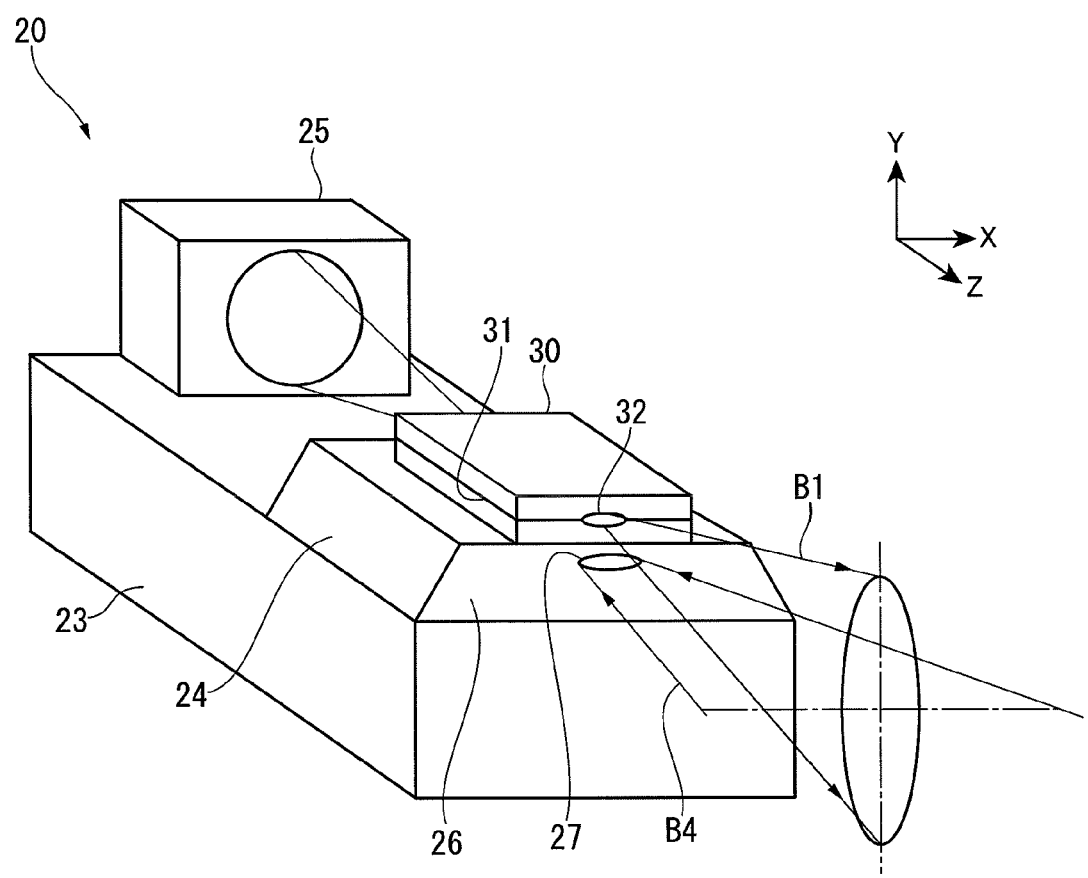
FIG. 3 is a schematic perspective view showing the relevant part of the exemplary embodiment.

The details of the bracket 23 and the saddle 24 serving as both of the support and the heat sink and the photodetector 25 shown in FIG. 3 have been described above.

The laser source element 30 includes an active layer 31 interposed between two semiconductor layers and has alight-emitting region 32, through which the laser beam B1 is emitted, on an end face thereof.

The saddle 24 has a return-light-receiving surface 26 on aside provided with the light-emitting region 32. The above-described laser beam B4 (return light) is incident on the return-light-receiving surface 26 to form a spot mark 27.

The spot mark 27 appearing on the return-light-receiving surface 26 is in a form of an ellipse having a long axis in the X direction. The spot mark 27 is located close to a side of the return-light-receiving surface 26 adjacent to the laser source element 30.

The spot mark 27 is in the form of the ellipse having a long axis extending in the X direction due to the following arrangements.

Figure 4A:
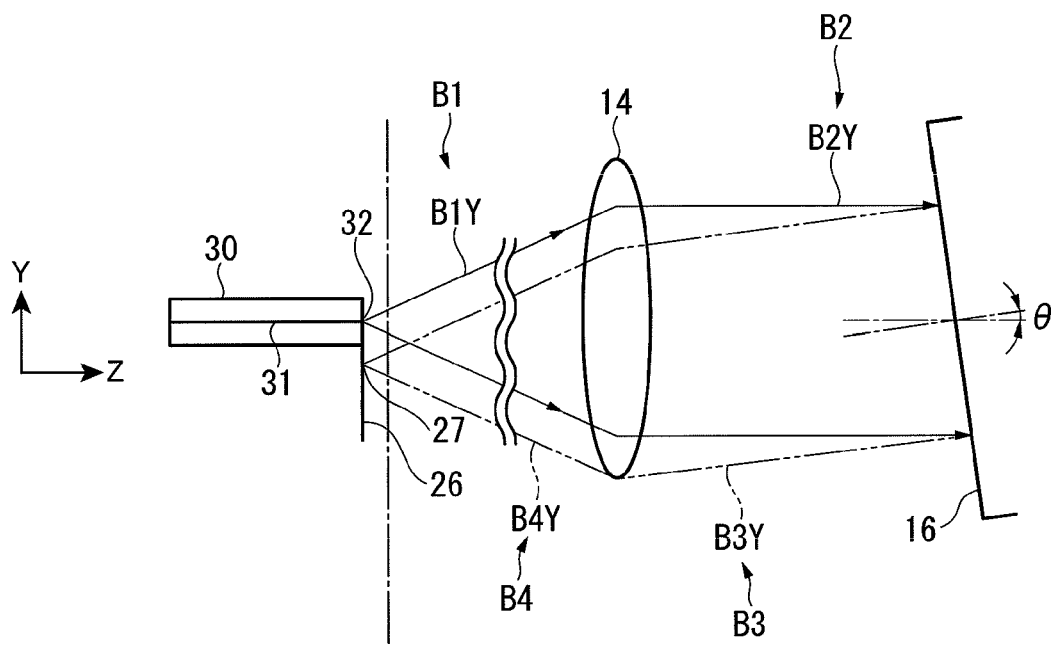
FIG. 4A is a schematic illustration showing a laser beam of the exemplary embodiment.
Figure 4B:
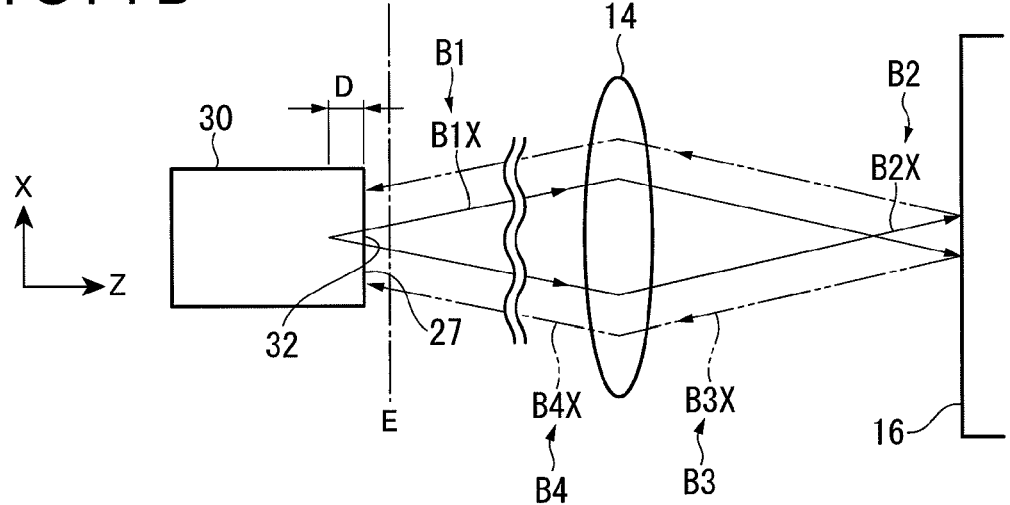
FIG. 4B is another schematic illustration showing the laser beam of the exemplary embodiment.

As shown in FIGS. 4A and 4B, the laser beam B1 emitted from the laser source element 30 involves an astigmatic difference D between a Y-direction component (see FIG. 4A) intersecting the active layer 31 and an X-direction component see FIG. 4B) along the active layer 31, so that the beam shape (cross sectional shape of the beam) changes along the optical axis in the Z direction.

As shown in FIG. 4A, the Y-direction component B1Y of the laser beam B1 has a focus at an emission end of the laser source element 30 and exhibits a relatively small height in the Y direction at the light-emitting region 32.

As shown in FIG. 4B, the X-direction component B1X of the laser beam B1 has a focus at a position deeper than the emission end of the laser source element 30 and exhibits a relatively large width in the X direction at the light-emitting region 32.

Accordingly, the beam shape of the laser beam B1 at the light-emitting region 32 is an ellipse that is narrow in the Y direction and wide in the X direction (i.e. an ellipse with a long axis along the X direction).

Though the width of the Y-direction component B1Y of the laser beam B1 is narrower than the width of the X-direction component B1X at the light-emitting region 32, since the diffusion angle of the component B1Y is greater than that of the component B1X, the widths of the components B1X and B1Y become the same at a border E. In other words, the beam shape of the laser beam B1 becomes circular at the border E.

Further, the width of the Y-direction component B1Y becomes wider than the width of the X-direction component B1X in a region beyond the border E, so that the beam shape of the laser beam B1 becomes an ellipse that is wide in the Y direction and narrow in the X direction (i.e. an ellipse having a long axis along the Y direction).

In the laser source element 30, the region from the light-emitting region 32 to the border E defines a near-field region and a region beyond the border E defines a far-field region.

In the exemplary embodiment, the collimating lens 14 is disposed in the far-field region beyond the border E, so that the laser beam B1 collimated by the collimating lens 14 has an ellipseal beam shape having a long axis in the Y direction.

The optical properties of the collimating lens 14 are configured to collimate the Y-direction component MY of the laser beam B1 emitted from the laser source element 30.

Accordingly, the Y-direction component B2Y of the laser beam B2 having passed through the collimating lens 14 is incident on the optical filter 16 in a form of a parallel beam (see FIG. 4A).

On the other hand, the X-direction component B IX of the laser beam B1 having passed through the collimating lens 14 is not a parallel beam but is a beam that is once converged and diffused again (see FIG. 4B).

As described above with reference to FIG. 2, a part of the laser beam B2 is reflected by the surface of the optical filter 16 to be turned into the return light (laser beams B3, B4) that returns toward the collimating lens 14 and the laser source element 30.

The optical filter 16 is tilted in the Y direction by the angle $\theta$ with respect to the Z direction (i.e. the direction of the main optical axis of the laser beam B1), so that the laser beam B4 returning toward the laser source element 30 forms the spot mark 27 not only on the light-emitting region 32 but also on the surface of the return-light-receiving surface 26 adjacent to the laser source element 30.

Though the Y-direction component B3Y of the laser beam 93 is a parallel beam as with the component B2Y, the Y-direction component B4Y of the laser beam 94 having passed through the collimating lens 14 in the opposite direction becomes a converging beam, so that the width of the spot mark 27 in the Y direction becomes narrow.

On the other hand, the X-direction component B3X of the laser beam 93 is a diffusion light as with the component B2X. Though the X-direction component B4X of the laser beam 94 having passed through the collimating lens 14 in the opposite direction becomes a converging light beam, the converging angle of the component B4X is gentle, so that the width of the spot mark 27 in the X direction becomes narrow.

Accordingly, the beam shape of the laser beam B4 (return light) at the spot mark 27 is an ellipse that is narrow in the Y direction and wide in the X direction (i.e. an ellipse with a long axis along the X direction).

As described above, due to the astigmatic difference D of the laser source element 30, the beam shape of the laser beam B1 is an ellipse having a long axis along the active layer 31 in the emitting end (near-field) of the laser beam B1. However, the beam shape of the laser beam B1 is an ellipse having a long axis in the Y direction intersecting the active layer 31 in the region (far-field) beyond the border E.

Further, since the collimating lens 14 is disposed so that the Y direction component B1Y of the laser beam B1 (i.e. the long axis of the ellipse in the far-field region) is collimated, the beam shape of the laser beam B3 reflected by the optical filter 16 to be returned to the laser source element 30 is an ellipse having a long axis along the active layer 31 near the emitting end as with the laser beam B1 emitted from the emitting end.

As described above, since the spot mark 27 formed on the return-light-receiving surface 26 is an ellipse elongated in the X direction along the active layer 31, even when the tilt angle of the optical axis of the laser beam B4 (return light) with respect to the Z direction is small, the laser beam B4 is kept from being incident on the active layer 31. In other words, the spot mark 27 is kept from overlapping the active layer 31.

In the exemplary embodiment, it is preferable that the tilt angle of the optical axis of the laser beam B4 (return light) with respect to the Z direction is preferably as small as possible within a range capable of keeping the laser beam 94 from being incident on the active layer 31 (i.e. a range capable of keeping the spot mark 27 from overlapping the active layer 31).

The tilt of the laser beam B4 can be adjusted through the adjustment of the above-described tilt angle $\theta$ of the optical filter 16.

In the exemplary embodiment, the tilt angle $\theta$ of the optical filter 16 is performed as follows.

Figure 5:
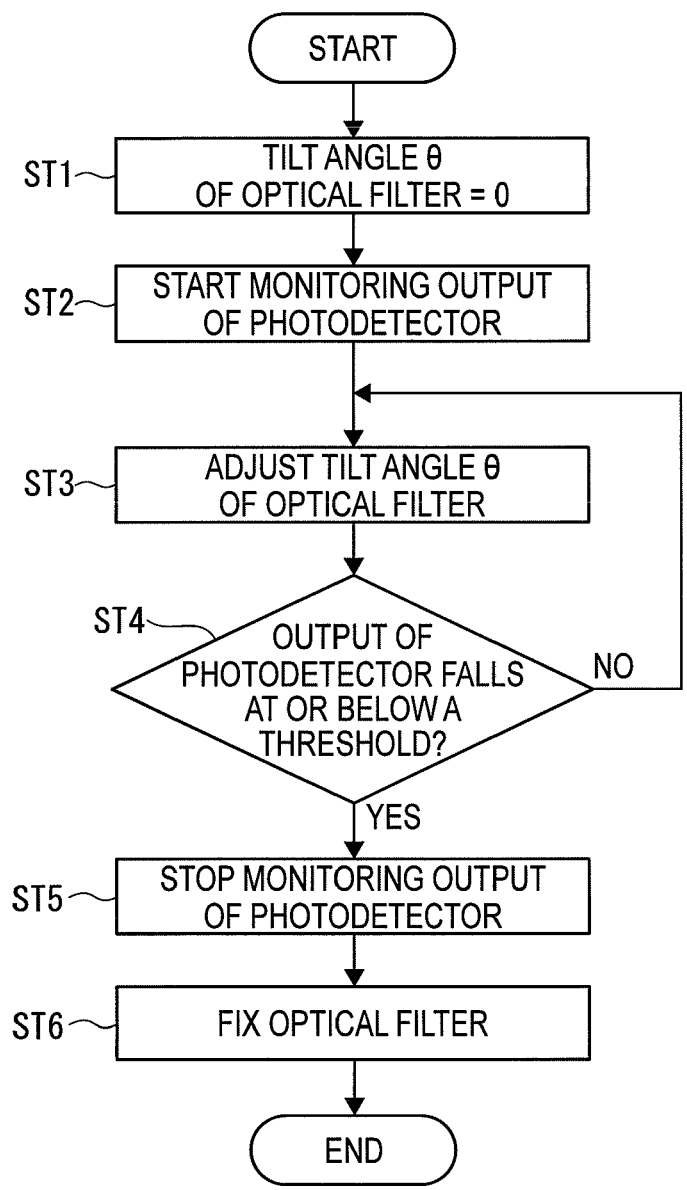
FIG. 5 is a flow chart showing adjustment steps in the exemplary embodiment.
Figure 6:
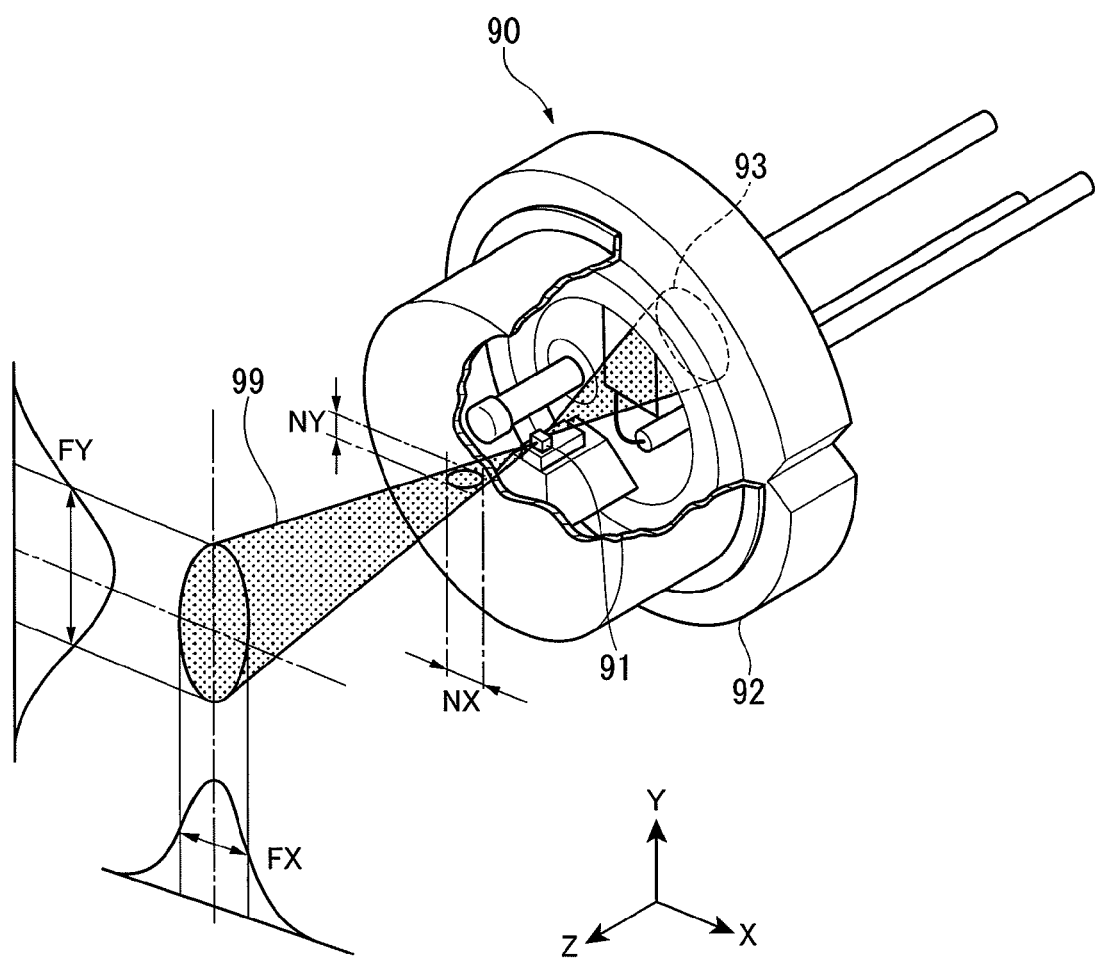
FIG. 6 is a perspective view showing a relevant part of a typical laser source device.

As shown in FIG. 5, in order to adjust the tilt angle $\theta$ of the optical filter 16, the optical filter 16 is set in an attitude of the tilt angle $\theta=0$ (i.e. the optical filter 16 is not tilted) (step ST1).

When the optical filter 16 is not tilted, the laser beam B4 (return light) returns to the laser source element 30 along the Z direction, so that the spot mark 27 overlaps the light-emitting region 32 and output signals of the photodetector 25 are at a high level.

Next, the monitoring of the output signal of the photodetector 25 is started (step ST2), and the optical filter 16 is tilted in the Y direction while monitoring the output signal to adjust the angle $\theta$ so that the spot mark 27 moves toward the return-light-receiving surface 26 (step ST3).

Specifically, the output signal of the photodetector 25 is repeatedly checked each time the tilt angle $\theta$ is increased (step ST4), and, when the output signal of the photodetector 25 is higher than a threshold, the tilt is further increased (step ST3). When it is judged that the output signal of the photodetector 25 is the threshold or less (step ST4), the monitoring of the photodetector 25 is stopped (step ST5), and the optical filter 16 is fixed at the tilt angle $\theta$ (step ST6).

As a result of the adjustment process, the spot mark 27 of the return light is moved away from the laser source element 30, thereby preventing the laser beam B4 (return light) from being incident on the laser source element 30.

Further, the tilt angle $\theta$ reached after the adjustment is the minimum angle required for separating the spot mark 27 away from the laser source element 30, so that the tilt of the optical filter 16 can be minimized.

The following effects can be obtained by the exemplary embodiment.

The laser source device of the exemplary embodiment includes the laser source element configured to emit the laser beam, and the optical element disposed downstream of the laser source element. The laser source device includes the return-light-receiving surface at a position shifted in a direction intersecting the active layer of the laser source element and the optical element is tilted with respect to the optical axis of the laser beam on that the return light reflected by the optical element is incident on the return-light-receiving surface.

In the exemplary embodiment, since the optical filter 16 is tilted, the return light (laser beam B4) from the optical filter 16 is incident on the return-light-receiving surface 2.6 and is not incident on the laser source element 30. Accordingly, the generation of the laser beam B1 in the laser source element 30 is not influenced by the return light and the stable laser beam B1 can be obtained.

Further, since the optical filter 16 is tilted and the return-light-receiving surface 26 is oriented in the Y direction intersecting the active layer 31 of the laser source element 30, the beam shape (spot mark 27) of the laser beam B4 incident on the return-light-receiving surface 26 assumes an ellipse that is thinned in the Y direction intersecting the active layer 31 and has the long axis extending along the X direction along the active layer 31, so that the tilt angle of the optical filter 16 can be minimized.

In other words, even when the tilt angle θ of the optical filter 16 is small, a part of the laser beam B4 incident on the return-light-receiving surface 26 can be kept from being incident on the laser source element 30.

Further, since the laser beam 84 (return light) is received by the return-light-receiving surface 26, the laser beam B4 is kept from being incident on the photodetector 25 at the back of the laser source element 30, so that the laser beam B4 is kept from influencing on the photodetector 25 and the laser output can be stably controlled.

In the exemplary embodiment, the laser source element 30 is supported by the bracket 23 and the saddle 24. In the above arrangement, since the saddle 24 also serves as a heat sink, the heat from the laser source element 30 can be effectively diffused with a simple structure.

Further, since the return-light-receiving surface 26 is defined on the surface of the saddle 24, the structure can be simplified by the dual purpose use of the component.

In the exemplary embodiment, the collimating lens 14 is disposed between the optical filter 16 and the laser source element 30 and the collimating lens 14 is configured to collimate the Y-direction component B1Y of the laser beam B1 intersecting the active layer 31 into the component B2Y (parallel beam).

Further, the collimating lens 14 is disposed in the optical axis of the laser beam B1 in the far-field region, in which the beam shape of the laser beam B1 becomes an ellipse elongated in the Y direction intersecting the active layer 31.

With the above arrangement, the beam shape (spot mark 27) of the laser beam B4 incident on the return-light-receiving surface 26 can be thinned in the Y direction intersecting the active layer 31, thereby minimizing the tilt angle θ of the optical filter 16 required for keeping the laser beam B4 (return light) from being incident on the laser source element 30. In other words, even when the tilt angle θ of the optical filter 16 is small, a part of the laser beam B4 incident on the return-light-receiving surface 26 can be kept from being incident on the laser source element 30.

In the exemplary embodiment, in order to adjust the tilt angle θ of the optical filter 16, the return light (laser beam 84) incident on the laser source element 30 is monitored with reference to the output signal of the photodetector 25, and the tilt angle is fixed when the output signal of the photodetector 25 falls at or below the predetermined threshold. Accordingly, the tilt angle θ can be set to the minimum while keeping the laser beam B4 from being incident on the laser source element 30.

Incidentally, it should be understood that the scope of the present invention is not limited to the above-described exemplary embodiment(s) but includes modifications and the like as long as the modifications and the like are compatible with the invention The optical element used in the exemplary embodiment is exemplified by the optical filter 16. However, the optical element may alternatively be an etalon plate, a polarization plate and various wave plates, a prism, a protection transparent plate and a combination thereof.

The combination of the collimating lens 14 (an optical element generating substantially no return light) and the optical filter 16 (a flat optical element generating the return light) is used in the exemplary embodiment. However, when one of the sides of the collimating lens 14 is thinned to generate the return light, the tilt of the collimating lens 14 may be adjusted. Further, it is not necessary for the laser source device 10 to have the collimating lens 14.

In the exemplary embodiment, the laser source element 30 is supported by the bracket 23 and the saddle 24 and the surface of the saddle 24 is used as the return-light-receiving surface 26. However, it is not necessary to use the bracket 23 and the saddle 24 as the support of the laser source element 30 and to use the surface of the support as the return-light-receiving surface 26.

For instance, the support of the laser source element 30 may support side faces (both sides in the X direction) or other portion of the laser source element 30.

In this arrangement, it is only necessary that an independent member for forming the return-light-receiving surface 26 (e.g. shield plate) is provided at a position shifted from the light-emitting region 32 of the laser source element 30 in the Y direction.

What is claimed is:

1. A laser source device comprising:
   a laser source element configured to emit a laser beam;
   an optical element disposed downstream of the laser source element; and
   a return-light-receiving surface provided at a position shifted in a direction intersecting an active layer of the laser source element, wherein
   the optical element is tilted with respect to an optical axis of the laser beam so that a return light of the laser beam reflected by the optical element is incident on the return-light-receiving surface.

2. The laser source device according to claim 1, wherein the laser source element is supported by a support oriented in the direction intersecting the active layer of the laser source element, a surface of the support defining the return-light-receiving surface.

3. The laser source device according to claim 1, further comprising:
   a collimating lens disposed between the optical element and the laser source element, wherein
   the collimating lens collimates a component of the laser beam in the direction intersecting the active layer into a parallel beam, the collimating lens being provided in the optical axis of the laser beam and in a region where a beam shape of the laser beam is an ellipse elongated in the direction intersecting the active layer.

4. An adjustment method of a laser source device, the laser source device comprising a laser source element configured to emit a laser beam, an optical element disposed downstream of the laser source element, a return-light-receiving surface disposed at a position shifted in a direction intersecting an active layer of the laser source element and a photodetector disposed opposite the optical element with respect to the laser source element, the optical element being tilted with respect to an optical axis of the laser beam so that a return light of the laser beam reflected by the optical element is incident on the return-light-receiving surface, the method comprising:
  adjusting a tilt of the optical element with respect to the direction intersecting the active layer while monitoring an output signal of the photodetector; and
  fixing the tilt of the optical element when the output signal of the photodetector falls at or below a predetermined threshold.

* * * * *